US007000203B2

(12) United States Patent
Buffet et al.

(10) Patent No.: US 7,000,203 B2
(45) Date of Patent: Feb. 14, 2006

(54) EFFICIENT AND COMPREHENSIVE METHOD TO CALCULATE IC PACKAGE OR PCB TRACE MUTUAL INDUCTANCE USING CIRCULAR SEGMENTS AND LOOKUP TABLES

(75) Inventors: Patrick H. Buffet, Essex Junction, VT (US); Charles S. Chiu, Essex Junction, VT (US); Gustina B. Collins, Blacksburg, VA (US); Craig P. Lussier, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 10/605,983

(22) Filed: Nov. 12, 2003

(65) Prior Publication Data

US 2005/0102641 A1   May 12, 2005

(51) Int. Cl.
  *G06F 17/50* (2006.01)
  *G06F 17/17* (2006.01)
  *G06F 19/00* (2006.01)
  *G01R 27/26* (2006.01)
(52) U.S. Cl. ............... 716/5; 716/7; 703/2; 703/14; 702/118
(58) Field of Classification Search ............ 716/5, 716/7; 703/2, 14; 702/118
See application file for complete search history.

(56) References Cited

U.S. PATENT DOCUMENTS 5,592,089 A * 1/1997 Danby et al. ............ 324/318

| | | | |
|---|---|---|---|
| 6,519,556 B1 * | 2/2003 | Chikamichi | 703/13 |
| 6,667,674 B1 * | 12/2003 | de Swiet et al. | 333/219 |
| 2003/0125919 A1 * | 7/2003 | Chikamichi | 703/14 |
| 2003/0193380 A1 * | 10/2003 | de Swiet et al. | 333/219 |
| 2004/0080392 A1 * | 4/2004 | Yu et al. | 336/200 |
| 2004/0183640 A1 * | 9/2004 | Bohler et al. | 336/182 |

FOREIGN PATENT DOCUMENTS

JP     04137506 A  *  5/1992

OTHER PUBLICATIONS

Luo et al., "Modelling of multiple coupled concentric open and closed microstrip ring structure", IEE Proceedings of Microwaves, Antennas and Propagation, vol. 138, No. 6, Dec. 1991, pp. 573-576.*

(Continued)

*Primary Examiner*—Matthew Smith
*Assistant Examiner*—Phallaka Kik
(74) *Attorney, Agent, or Firm*—Gibb I.P. Law Firm, LLC; Richard A. Henkler, Esq.

(57) ABSTRACT

Disclosed is an improved method of determining mutual inductance of wires in an electronic design. First, the invention selects a pair of wires. Then, the invention adds concentric ring lines to the design. The invention then adds straight line segments representing each wire between points where each corresponding wire crosses the adjacent ring lines. Each of the straight lines run from a point where a corresponding wire crosses an outer concentric ring line to a point where the corresponding wire crosses an inner concentric ring line. The invention can then very simply calculate the mutual inductance between the straight line segments (not the actual potentially non-linear wires themselves). The mutual inductance of the straight line segments only comprises an approximate mutual inductance of the wires because the actual mutual inductance of the wires may be slightly different if the wires are non-linear.

20 Claims, 2 Drawing Sheets

OTHER PUBLICATIONS

Leduc et al., "Modeling of integrated circuit inductors with a coplanar ground plane using the PEEC method", 33rd European Microwave Conference, vol. 1, Oct. 7-9, 2003, pp. 447-450.*

Diestel, "A Quasi-TEM Analysis for Curved and Straight Planar Multiconductor Systems", IEEE Transactions on Microwave Theory and Techniques, vol. 37, No. 4, Apr. 1989, pp. 748-753.*

Green, "Conductor Geometry Independence of Phase Velocity in TEM-Mode Transmission Lines", IEEE Transactions on Microwave Theory and Techniques, vol. 37, No. 4, Apr. 1989, p. 805.*

* cited by examiner

EFFICIENT AND COMPREHENSIVE METHOD TO CALCULATE IC PACKAGE OR PCB TRACE MUTUAL INDUCTANCE USING CIRCULAR SEGMENTS AND LOOKUP TABLES

BACKGROUND OF INVENTION

1. Field of the Invention

The present invention generally relates to the evaluation of circuit designs and more particularly to an improved method of determining mutual inductance of wires in an electronic design.

2. Description of the Related Art

With today's fast off chip signal switching speed, signal integrity analysis is very important. Simulation with accurate integrated circuit (IC) package signal to signal mutual inductance is very critical to the analysis, and the same is true for (printed circuit boards) PCB. Conventional systems sometimes used a slow, expensive, yet highly accurate electromagnetic (EM) field solver to determine the mutual inductance between or connected to wires on the chip. This conventional system has many sophisticated features to account for the different non-linear shapes of the wires, their distances, etc. However, using an EM field solver to generate mutual inductance is very time consuming and computer resource intensive and not practical for a large number of nets.

The conventional method requires the input of the geometry of the signal traces and power plane structure into the electromagnetic (EM) field solver to generate the mutual inductances. This method is very accurate, but is also very time consuming and difficult to setup when there are hundreds or thousands of nets. Therefore, there is a need for an improved method of determining mutual inductance that avoids the time and cost associated with conventional techniques. The invention described below provides such a methodology.

SUMMARY OF INVENTION

The invention provides an improved method of determining mutual inductance of wires in an electronic design. First, the invention selects a pair of wires. Then, the invention adds concentric ring lines to the design. The invention then adds straight line segments representing each wire between points where each corresponding wire crosses the adjacent ring lines. Each of the straight lines run from a point where a corresponding wire crosses an outer concentric ring line to a point where the corresponding wire crosses an inner concentric ring line. The invention can then very simply calculate the mutual inductance between the straight line segments (not the actual potentially non-linear wires themselves). The mutual inductance of the straight line segments only comprises an approximate mutual inductance of the wires because the actual mutual inductance of the wires may be slightly different if the wires are non-linear.

The invention repeats the foregoing processes for each pair of wires until all wire pairs in the system are covered. By summing all calculated mutual inductances of the line segments, the invention produces an approximate mutual inductance of all the wires within the design. Further, the invention can reduce the inductance based on the angle by which the straight line segments deviate from being parallel to one another.

BRIEF DESCRIPTION OF DRAWINGS

The foregoing and other objects, aspects and advantages will be better understood from the following detailed description of a preferred embodiment(s) of the invention with reference to the drawings, in which.

DETAILED DESCRIPTION

As mentioned above, there is a need to reduce the cost and time associated with finding mutual inductance of wires on integrated circuit designs and chips. The invention provides a methodology that substantially simplifies the process of finding mutual inductance of wires on integrated circuit designs. While this simplification comes at the price of a slight reduction in accuracy, the overall savings in time and computing resources more than makes up for the reduction in accuracy. For example, with the invention, the computer run time to calculate the mutual inductance of wires in an integrated circuit chip will be minutes as compared to days when using direct EM simulation.

Figure 1:
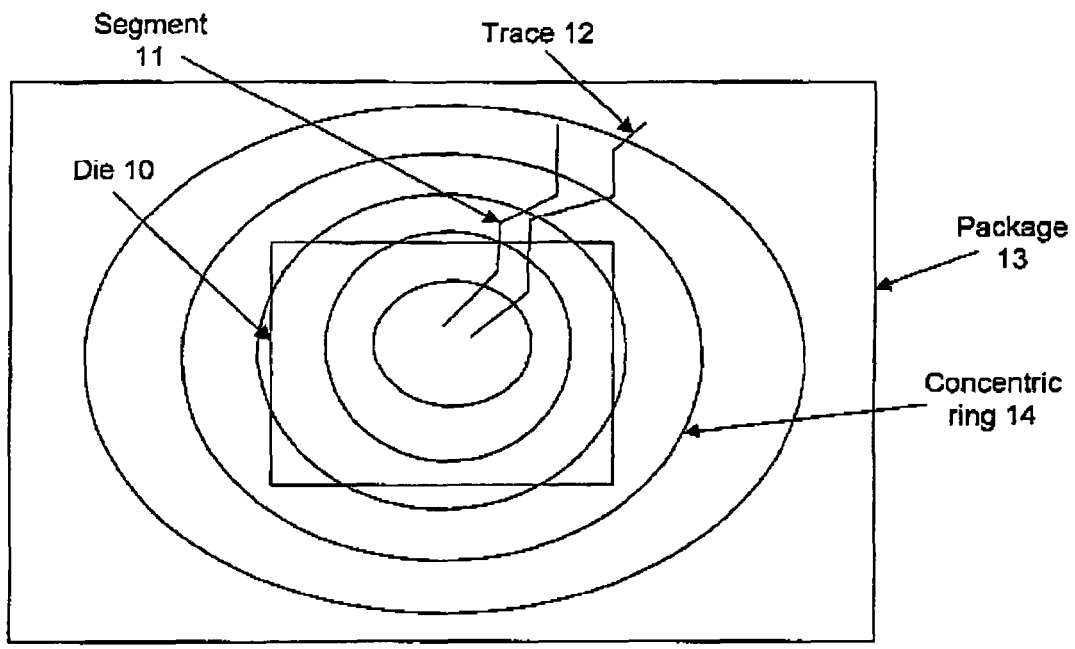
FIG. 1 is a schematic diagram of an electronic design having concentric rings added thereto.

The invention begins first by selecting a pair of traces and then draws concentric rings 14 on the design, as shown in FIG. 1. The electronic design can comprise an integrated circuit (IC), package, and printed circuit board (PCB), wiring design, or any other type of design that includes conductive features that would produce mutual inductance. FIG. 1 illustrates an exemplary die 10 wiring segments/traces 11, 12. Item 13 illustrates the package in which the die 10 is contained. The concentric rings can cover just a portion of the design (if only a portion of the design is to be evaluated). Alternatively, the rings 14 can cover the entire design or even go beyond the design boundaries if necessary to cover all aspects of the design.

Figure 2:
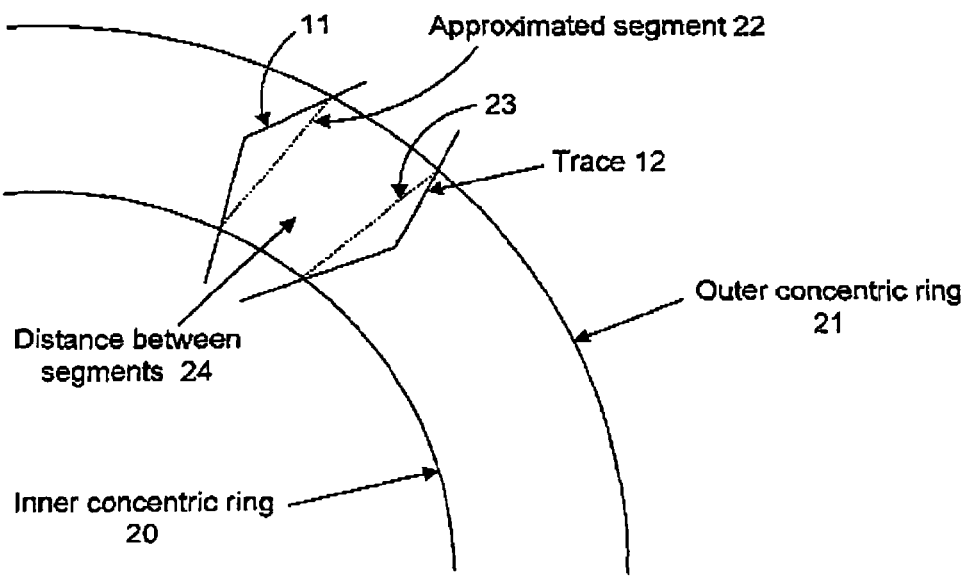
FIG. 2 is an expanded schematic diagram of a portion of the drawing shown FIG. 1.

Signal wire to signal wire mutual inductance is calculated by dividing the traces 11, 12 into wiring segments that run between two adjacent concentric rings (an inner concentric ring 20 and an outer concentric ring 21) as shown in FIG. 2. Then, the invention adds straight line segments 22, 23 representing each wire 11, 12 between points where each corresponding wire crosses the adjacent ring lines 20, 21. Each of the straight lines run from a point where a corresponding wire (e.g., 11) crosses the outer concentric ring line 21 to a point where the corresponding wire (e.g., 11) crosses the inner concentric ring line 20. The invention can then very simply calculate the mutual inductance between the straight line segments (not the actual potentially non-linear wires themselves) based on the distance 24 between the centers of the segments 22, 23. The mutual inductance of the straight line segments only comprises an approximate mutual inductance of the wires because the actual mutual inductance of the wires may be slightly different if the wires are non-linear.

The process of "calculating" the mutual inductance between the straight line segments 22, 23 can comprise an actual calculation or a simple reference to a previously prepared table. The actual calculation can be performed using any conventional inductance calculation scheme, such as the EM field solver algorithm discussed above. Alternatively, a table of mutual inductances that is based upon distances between straight wires can be calculated beforehand (again using any conventional inductance calculation scheme). Then, wiring segment to wiring segment mutual inductance is approximated simply by finding the separation distance 24 and looking up the mutual inductance values from the table. The inductance per unit length from the table is multiplied by the segment length to obtain the mutual inductance for this segment. If the distance between adjacent rings is made small enough, the error introduced by segment approximation is negligible.

The tables can be built for mutual inductance per unit length for different spacings and cross-sections so that they are easily applied to many different types of wiring designs. Therefore, preferably, the invention first sets up the tables of mutual inductance values based on trace to trace separation distance using a conventional EM field solver. These tables only need to be setup once and can be reused over and over again. This method provides a fast and systematic method which is easily implemented in a computer program.

The invention repeats the foregoing processes for each pair of wires and the same process is repeated for any two wire pair combinations until all traces are accounted for. Thus, this method can be used for two or more (unlimited number) traces because the mutual inductance between two trace is independent of the existence of other traces. This invention can also be easily used to generate mutual inductance for signal two traces by simply comparing a given wire to all other wires. With the invention each line that crosses adjacent concentric ring lines is compared to another line that cross the same concentric ring lines, one pair at a time. By summing all approximated mutual inductances of the line segments, the invention produces an approximate mutual inductance between a pair of wires. The same process is repeated for all wire pair combinations.

To increase accuracy, the mutual inductance is further adjusted by a scaling factor (cosine of angle) which accounts for the angle between the two segments. For example, if the two segments are perpendicular and at a right angle (90 degree) to one another, the scaling factor should be 0 (right angle has no mutual inductance). If two segments are parallel (0 degree difference), the scaling factor is 1 (100% of parallel line coupling).

Figure 3:
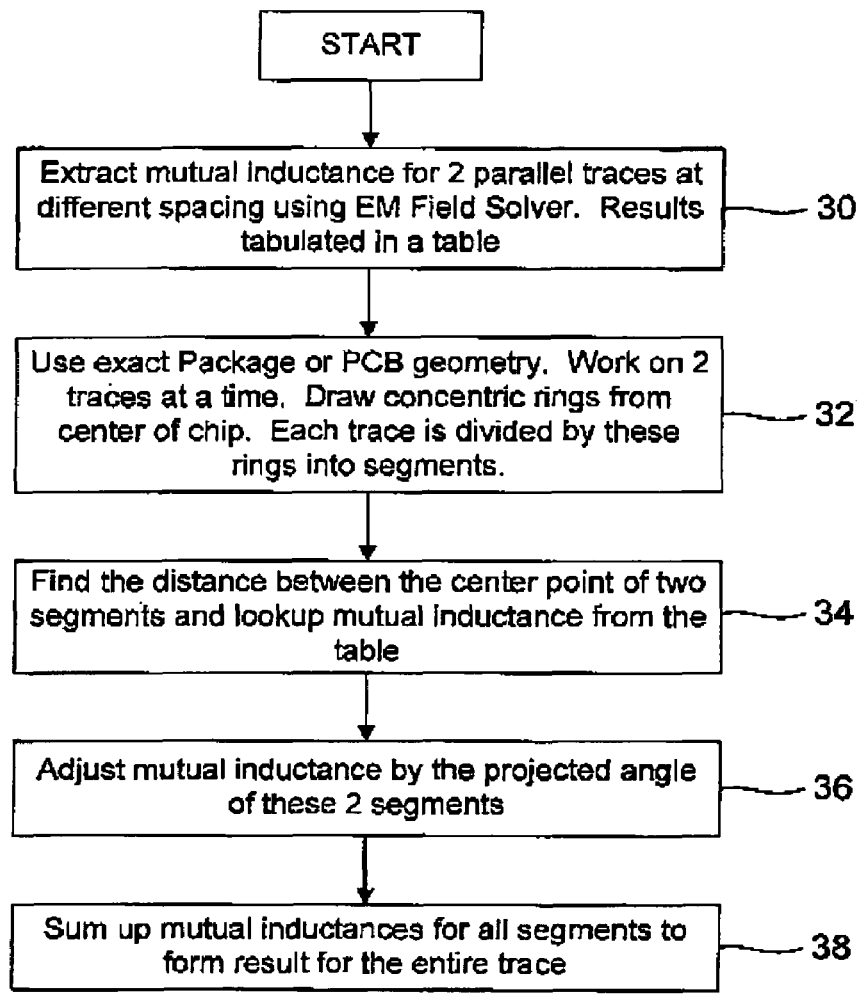
FIG. 3 is a flow diagram illustrating a preferred method of the invention.

FIG. 3 shows the forgoing process in flowchart form. In item 30, the invention sets up the tables by extracting the mutual inductance of two theoretical parallel traces at different spacings using any conventional EM field solver. In item 32, the invention begins with the integrated circuit package or PCB geometry. The invention works on two traces at a time and draws concentric rings from the center of the chip. Alternatively, if wires are not wired out radially, the center of said concentric rings changes for each different pair of wires. Therefore, the invention can reposition the center of the concentric rings at an intersection of the straight line projections of the beginning and ending points of each pair of wires.

Each of the traces is divided by the rings into segments. In item 34, the invention finds the distance between the center points of the two segments and looks up the mutual inductance of such a distance from the previously prepared table. The invention then adjusts the mutual inductance based upon the difference in angle of the two segments in item 36. Finally, in item 38, the invention sums up the mutual inductances for all segments to form an approximate mutual inductance for the entire trace or for the entire design.

While the invention has been described in terms of preferred embodiments, those skilled in the art will recognize that the invention can be practiced with modification within the spirit and scope of the appended claims.

What is claimed is:

1. A method of determining inductance of wires in an electronic design, said method comprising:
   selecting a pair of wires;
   adding concentric ring lines to said design to divide said pair of wires into wire segments;
   adding straight line segments representing each wire between points where each corresponding wire crosses adjacent ring lines; and
   calculating a mutual inductance between said straight line segments, wherein said mutual inductance of said straight line segments comprises an approximate mutual inductance of said wires.

2. The method in claim 1, further comprising repeating said selecting and calculating for each pair of wires that cross said adjacent ring lines.

3. The method in claim 1, further comprising repeating said selecting, adding straight line segments, and calculating processes for each pair of said adjacent ring lines.

4. The method in claim 1, wherein said calculating process reduces said inductance based on an angle by which said straight line segments deviate from being parallel to one another.

5. The method in claim 1, wherein said concentric ring lines all have a center of said circuit design as their center.

6. The method in claim 1, wherein a center of said concentric ring lines changes for each different pair of wires.

7. The method in claim 1, wherein said concentric ring lines are equally spaced from one other.

8. The method in claim 1, wherein each of said straight line segments runs from a point where a corresponding wire crosses an outer concentric ring line to a point where said corresponding wire crosses an inner concentric ring line.

9. A method of determining inductance of wires in an electronic design, said method comprising:
   selecting a pair of wires;
   adding concentric ring lines to said design to divide said pair of wires into wire segments;
   adding straight line segments representing each wire between points where each corresponding wire crosses adjacent ring lines; and
   determining a mutual inductance between said straight line segments by referring to a pre-calculation table, wherein said mutual inductance of said straight line segments comprises an approximate mutual inductance of said wires.

10. The method in claim 9, further comprising repeating said selecting and determining for each pair of wires that cross said adjacent ring lines.

11. The method in claim 9, further comprising repeating said selecting, adding straight line segments, and determining processes for each pair of said adjacent ring lines.

12. The method in claim 9, wherein said calculating reduces said inductance based on an angle by which said straight line segments deviate from being parallel to one another.

13. The method in claim 9, wherein said concentric ring lines all have a center of said circuit design as their center.

14. The method in claim 9, wherein said concentric ring lines are equally spaced from one other.

15. The method in claim 9, wherein each of said straight line segments runs from a point where a corresponding wire crosses an outer concentric ring line to a point where said corresponding wire crosses an inner concentric ring line.

16. A method of determining inductance of wires in an electronic design, said method comprising:
   a) selecting a pair of wires;

b) adding concentric ring lines to said design to divide said pair of wires into wire segments;
c) adding straight line segments representing each wire between points where each corresponding wire crosses adjacent ring lines; and
d) calculating a mutual inductance between said straight line segments, wherein said mutual inductance of said straight line segments comprises an approximate mutual inductance of said wires;
e) repeating processes b–d for each pair of wires that cross said adjacent ring lines;
f) summing all calculated mutual inductances as an approximate mutual inductance of said circuit design; and
g) repeating processes a–f until all wire pairs have been processed.

17. The method in claim 16, wherein said calculating reduces said inductance based on an angle by which said straight line segments deviate from being parallel to one another.

18. The method in claim 16, wherein said concentric ring lines all have a center of said circuit design as their center.

19. The method in claim 16, wherein said concentric ring lines are equally spaced from one other.

20. The method in claim 16, wherein each of said straight line segments runs from a point where a corresponding wire crosses an outer concentric ring line to a point where said corresponding wire crosses an inner concentric ring line.

* * * * *